US009178484B2

(12) United States Patent
Masuda

(10) Patent No.: US 9,178,484 B2
(45) Date of Patent: Nov. 3, 2015

(54) FILTER

(71) Applicant: Murata Manufacturing Co., Ltd., Nagaokakyo-shi, Kyoto-fu (JP)

(72) Inventor: Yutaka Masuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/644,321

(22) Filed: Mar. 11, 2015

(65) Prior Publication Data
US 2015/0188508 A1 Jul. 2, 2015

Related U.S. Application Data

(63) Continuation of application No. PCT/JP2013/065709, filed on Jun. 6, 2013.

(30) Foreign Application Priority Data

Sep. 19, 2012 (JP) ................ 2012-206016

(51) Int. Cl.
*H03H 7/09* (2006.01)
*H03H 7/01* (2006.01)
*H03H 1/00* (2006.01)

(52) U.S. Cl.
CPC .............. *H03H 7/0115* (2013.01); *H03H 7/09* (2013.01); *H03H 7/1775* (2013.01); *H03H 2001/0085* (2013.01)

(58) Field of Classification Search
CPC ............ H03H 2001/0085; H03H 7/09; H03H 7/0115; H03H 7/1775
USPC ................................ 333/185, 175
See application file for complete search history.

(56) References Cited

U.S. PATENT DOCUMENTS 6,411,178 B1   6/2002 Matsumura et al.
8,018,299 B2*  9/2011 Chin et al. .................... 333/175
(Continued)

FOREIGN PATENT DOCUMENTS

JP   2001-136045 A   5/2001
JP   2003-045723 A   2/2003
(Continued)

OTHER PUBLICATIONS

Official Communication issued in International Patent Application No. PCT/JP2013/065709, mailed on Aug. 13, 2013.

*Primary Examiner* — Benny Lee
*Assistant Examiner* — Rakesh Patel
(74) *Attorney, Agent, or Firm* — Keating & Bennett, LLP

(57) ABSTRACT

In a filter, LC parallel resonators are arranged along an x-axis direction of a multilayer body and include coils and capacitors, respectively. LC parallel resonators adjacent to each other in the x-axis direction are electromagnetically coupled to each other. Each of the coils includes line conductor layers disposed on an insulating layer, a first via-hole conductor that extends from the line conductor layers to a negative direction of a z-axis direction and that is electrically connected to one conductor layer of the corresponding one of the capacitors, and a second via-hole conductor that extends from the line conductor layers to the negative side of the z-axis direction and that is electrically connected to the other conductor layer of the capacitor. A coupling conductor layer provides a capacitance between two line conductor layers which are adjacent to each other in the x-axis direction.

16 Claims, 12 Drawing Sheets

(56) References Cited

U.S. PATENT DOCUMENTS

| | | |
|---|---|---|
| 2006/0192637 A1 | 8/2006 | Urano et al. |
| 2007/0241839 A1 | 10/2007 | Taniguchi |
| 2010/0039189 A1 | 2/2010 | Taniguchi |
| 2011/0074526 A1 | 3/2011 | Taniguchi |

FOREIGN PATENT DOCUMENTS

| | | |
|---|---|---|
| JP | 2004-312065 A | 11/2004 |
| JP | 2011-071921 A | 4/2011 |
| WO | 2007/119356 A1 | 10/2007 |
| WO | 2008/143071 A1 | 11/2008 |

* cited by examiner

FILTER

BACKGROUND OF THE INVENTION

1. Field of the Invention

The present invention relates to a filter, and more particularly, to a filter including a plurality of LC parallel resonators.

2. Description of the Related Art

As an invention concerning a known filter, a multilayer band pass filter disclosed in Japanese Unexamined Patent Application Publication No. 2011-71921, for example, is known. FIG. 14 is an exploded perspective view of a multilayer band pass filter 500 disclosed in Japanese Unexamined Patent Application Publication No. 2011-71921.

The multilayer band pass filter 500 includes dielectric layers 502a through 502g and LC parallel resonators 504 and 516. The dielectric layers 502a through 502g are formed in a rectangular shape and are stacked on each other from top to bottom in this order.

The LC parallel resonator 504 includes an inductor electrode 506, via electrodes 508 and 510, a capacitor electrode 512, and a ground electrode 514. The capacitor electrode 512 is disposed on the dielectric layer 502f. The ground electrode 514 is disposed on the dielectric layer 502g. The capacitor electrode 512 and the ground electrode 514 oppose each other with the dielectric layer 502f therebetween so as to form a capacitor.

The inductor electrode 506 is a linear conductor disposed on the dielectric layer 502b and extending in the front-and-rear direction. The via electrode 508 passes through the dielectric layers 502b through 502e in a direction in which the dielectric layers 502b through 502e are stacked. The top end of the via electrode 508 is connected to the rear end of the inductor electrode 506. The bottom end of the via electrode 508 is connected to the capacitor electrode 512. The via electrode 510 passes through the dielectric layers 502b through 502f in a direction in which the dielectric layers 502b through 502f are stacked. The top end of the via electrode 510 is connected to the front end of the inductor electrode 506. The bottom end of the via electrode 510 is connected to the ground electrode 514. With this configuration, the inductor electrode 506 and the via electrodes 508 and 510 form an inductor.

The LC parallel resonator 516 includes an inductor electrode 518, via electrodes 520 and 522, and capacitor electrodes 514 and 524. The capacitor electrode 524 is disposed on the dielectric layer 502f. The ground electrode 514 and the capacitor electrode 524 oppose each other with the dielectric layer 502f therebetween so as to form a capacitor.

The inductor electrode 518 is a linear conductor disposed on the dielectric layer 502b and extending in the front-and-rear direction. The via electrode 520 passes through the dielectric layers 502b through 502e in a direction in which the dielectric layers 502b through 502e are stacked. The top end of the via electrode 520 is connected to the rear end of the inductor electrode 518. The bottom end of the via electrode 520 is connected to the capacitor electrode 524. The via electrode 522 passes through the dielectric layers 502b through 502f in a direction in which the dielectric layers 502b through 502f are stacked. The top end of the via electrode 522 is connected to the front end of the inductor electrode 518. The bottom end of the via electrode 522 is connected to the capacitor electrode 514. With this configuration, the inductor electrode 518 and the via electrodes 520 and 522 form an inductor.

In the multilayer band pass filter 500 configured as described above, the two LC parallel resonators 504 and 516 are disposed side by side in the right-and-left direction. With this arrangement, the LC parallel resonators 504 and 516 are electromagnetically coupled to each other so as to form a band pass filter.

In the multilayer band pass filter 500 disclosed in Japanese Unexamined Patent Application Publication No. 2011-71921, it is difficult to intensify capacitive coupling between the LC parallel resonators 504 and 516. This will be described more specifically. In the multilayer band pass filter 500, the capacitive coupling between the LC parallel resonators 504 and 516 is adjusted in order to obtain a desired transmission characteristic. If it is desired that the pass bandwidth of the multilayer band pass filter 500 will be increased, intensifying of capacitive coupling between the LC parallel resonators 504 and 516 is effective. For intensifying capacitive coupling between the LC parallel resonators 504 and 516, the distance between the LC parallel resonators 504 and 516 is set to be decreased. Then, the capacitance formed between the via-hole electrodes 508 and 520 is increased, and the capacitance formed between the via-hole electrodes 510 and 522 is increased. As a result, a signal of a lower frequency side than the pass band is more likely to pass between the LC parallel resonators 504 and 516, thereby increasing the pass bandwidth of the multilayer band pass filter 500.

However, if the distance between the LC parallel resonators 504 and 516 is excessively decreased, short-circuiting may occur between the via-hole electrodes 508 and 520 and between the via-hole electrodes 510 and 522. Thus, in the multilayer band pass filter 500, it may be difficult to intensify capacitive coupling between the LC parallel resonators 504 and 516 to satisfy a desired frequency characteristic.

SUMMARY OF THE INVENTION

Accordingly, preferred embodiments of the present invention provide a filter in which it is possible to intensify capacitive coupling between LC parallel resonators.

A filter according to a preferred embodiment of the present invention includes a multilayer body including a plurality of insulating layers stacked on each other; a plurality of LC parallel resonators that are arranged along a first direction which is perpendicular or substantially perpendicular to a stacking direction of the multilayer body and that each include a coil and a capacitor; and a coupling conductor layer disposed on the insulating layer. The LC parallel resonators which are adjacent to each other in the first direction are electromagnetically coupled to each other. Each of the coils includes line conductor layers disposed on the insulating layer, a first via-hole conductor that extends from the line conductor layers to one side of the stacking direction and that is electrically connected to one conductor layer of the capacitor, and a second via-hole conductor that extends from the line conductor layers to one side of the stacking direction and that is electrically connected to the other conductor layer of the capacitor. The coupling conductor layer provides a capacitance between two of the line conductor layers which are adjacent to each other in the first direction.

According to various preferred embodiments of the present invention, it is possible to intensify capacitive coupling between LC parallel resonators.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Filters according to preferred embodiments of the present invention will be described below.

Figure 1:
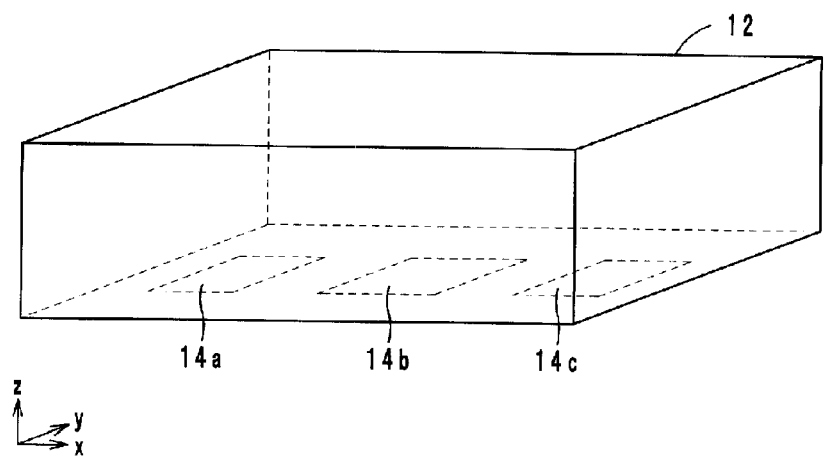
FIG. 1 is an external perspective view of a filter according to a preferred embodiment of the present invention.
Figure 2:
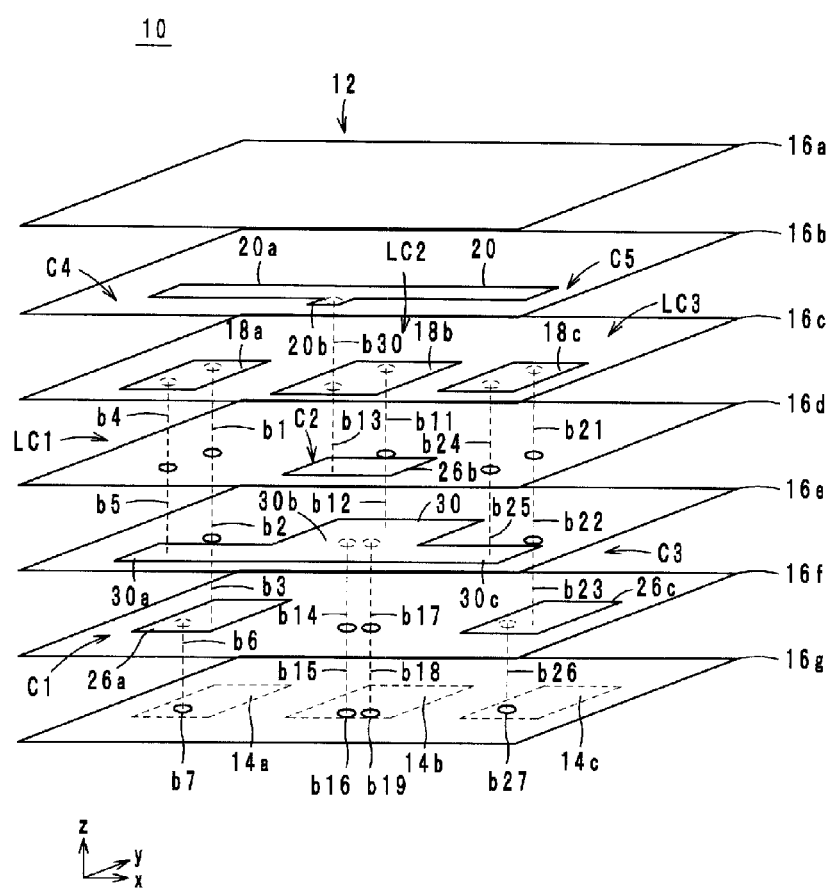
FIG. 2 is an exploded perspective view of a multilayer body of a filter.
Figure 3:
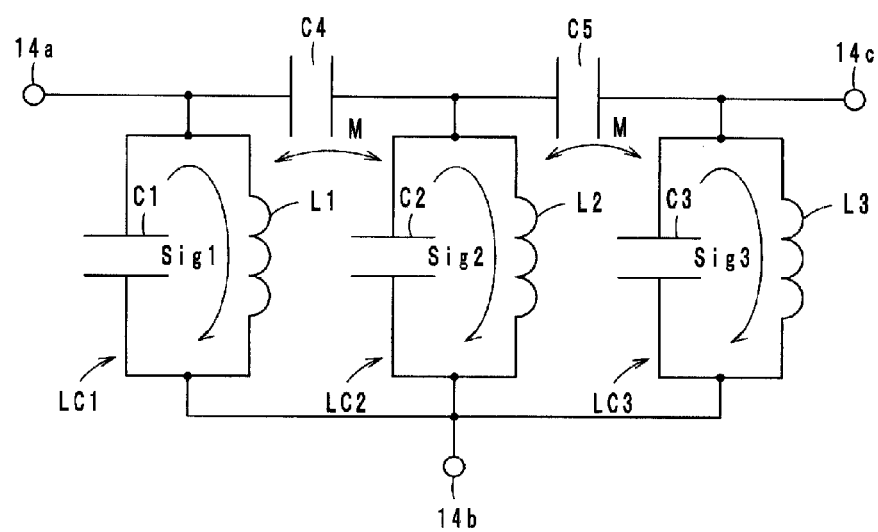
FIG. 3 is an equivalent circuit diagram of a filter.

The configurations of filters according to preferred embodiments of the present invention will be described below with reference to the drawings. FIG. 1 is an external perspective view of a filter 10 according to a preferred embodiment of the present invention. FIG. 2 is an exploded perspective view of a multilayer body 12 of the filter 10. FIG. 3 is an equivalent circuit diagram of the filter 10. In FIGS. 1 and 2, a z-axis direction is a direction in which insulating layers 16 are stacked on each other, an x-axis direction is a direction along the long sides of the filter 10, and y-axis direction is a direction along the short sides of the filter 10. The x-axis direction, y-axis direction, and z-axis direction are perpendicular or substantially perpendicular to each other.

The filter 10 preferably includes, as shown in FIGS. 1 and 2, the multilayer body 12, outer electrodes 14a through 14c, LC parallel resonators LC1 through LC3, capacitors C4 and C5, and via-hole conductors b6, b7, b14 through b19, b26, and b27.

As shown in FIG. 2, the multilayer body 12 preferably includes a stack of insulating layers 16a through 16g made of a ceramic dielectric medium and preferably having a rectangular or substantially rectangular parallelepiped shape. The multilayer body 12 also preferably includes the LC parallel resonators LC1 through LC3 and the capacitors C4 and C5 therein.

As shown in FIG. 2, the insulating layers 16a through 16g preferably have a rectangular or substantially rectangular shape, and are made of, for example, a ceramic dielectric medium. The insulating layers 16a through 16g are stacked on each other such that they are arranged from the positive side to the negative side of the z-axis direction in this order. Hereinafter, the surface of the insulating layer 16 in the positive side of the z-axis direction will be referred as a "front surface", while the surface of the insulating layer 16 in the negative side of the z-axis direction will be referred as a "back surface".

The LC parallel resonators LC1 through LC3 are arranged along the x-axis direction. In this preferred embodiment, as viewed from the z-axis direction, the LC parallel resonators LC1 through LC3 are arranged from the negative side to the positive side of the x-axis direction in this order. Among the LC parallel resonators LC1 through LC3, adjacent LC parallel resonators are electromagnetically coupled to each other so as to define a band pass filter.

The LC parallel resonator LC1 includes, as shown in FIG. 3, a coil L1 and a capacitor C1. As shown in FIG. 2, the LC parallel resonator LC1 preferably includes via-hole conductors b1 through b5, a line conductor layer 18a, a capacitor conductor layer 26a, and a ground conductor layer 30, and preferably has a loop-shaped configuration.

The capacitor C1 includes the capacitor conductor layer 26a and the ground conductor layer 30. The ground conductor layer 30 is a T-shaped conductor layer and includes an end portion 30a, a center portion 30b, and an end portion 30c. The center portion 30b is a rectangular or substantially rectangular conductor layer disposed at the center of the front surface of the insulating layer 16e. The end portion 30a is a rectangular or substantially rectangular conductor projecting from the negative side of the center portion 30b in the x-axis direction to the negative side of the x-axis direction. The end portion 30c is a rectangular or substantially rectangular conductor projecting from the positive side of the center portion 30b in the x-axis direction to the positive side of the x-axis direction.

The capacitor conductor layer 26a is a conductor layer opposing the end portion 30a of the ground conductor layer 30 with the insulating layer 16e therebetween, and is disposed on the front surface of the insulating layer 16f. With this arrangement, the electrostatic capacitance is generated between the capacitor conductor layer 26a and the ground conductor layer 30, thus defining the capacitor C1. The capacitor conductor layer 26a preferably has a rectangular or substantially rectangular shape having the long sides in the y-axis direction and is disposed on the more negative side of the x-axis direction than the intersecting point of the diagonal lines of the insulating layer 16f.

The coil L1 includes the via-hole conductors b1 through b5 and the line conductor layer 18a. The line conductor layer 18a is disposed on the front surface of the insulating layer 16c and is a linear conductor extending in the y-axis direction. The line conductor layer 18a is disposed on the more negative side of the x-axis direction than the intersecting point of the diagonal lines of the insulating layer 16c.

The via-hole conductors b1 through b3 pass through the insulating layers 16c through 16e, respectively, in the z-axis direction. The end portion of the via-hole conductor b1 in the positive side of the z-axis direction is connected to the end portion of the line conductor layer 18a in the positive side of the y-axis direction. The end portion of the via-hole conductor b2 in the positive side of the z-axis direction is connected to the end portion of the via-hole conductor b1 in the negative side of the z-axis direction. The end portion of the via-hole conductor b2 in the negative side of the z-axis direction is connected to the end portion of the via-hole conductor b3 in the positive side of the z-axis direction. The end portion of the via-hole conductor b3 in the negative side of the z-axis direction is connected to the capacitor conductor layer 26a. With this arrangement, the via-hole conductors b1 through b3 define a single via-hole conductor extending from the end portion of the line conductor layer 18a in the positive side of the y-axis direction to the negative side of the z-axis direction, and are connected to the capacitor conductor layer 26a.

The via-hole conductors b4 and b5 pass through the insulating layers 16c and 16d, respectively, in the z-axis direction, and are disposed on the more negative side of the y-axis direction than the via-hole conductors b1 through b3. The end portion of the via-hole conductor b4 in the positive side of the z-axis direction is connected to the end portion of the line conductor layer 18a in the negative side of the y-axis direction. The end portion of the via-hole conductor b4 in the negative side of the z-axis direction is connected to the end portion of the via-hole conductor b5 in the positive side of the z-axis direction. The end portion of the via-hole conductor b5 in the negative side of the z-axis direction is connected to the ground conductor layer 30. With this arrangement, the via-hole conductors b4 and b5 define a single via-hole conductor extending from the end portion of the line conductor layer 18a in the negative side of the y-axis direction to the negative side of the z-axis direction, and are connected to the ground conductor layer 30.

As described above, the coil L1 preferably has a loop-shaped configuration which starts from the connecting point between the via-hole conductor b5 and the ground conductor layer 30 as one end, passes through the via-hole conductors b4 and b5, the line conductor layer 18a, and the via-hole conductors b1 through b3, and reaches the connecting point between the via-hole conductor b3 and the capacitor conductor layer 26a as the other end.

The LC parallel resonator LC1 configured as described above defines a loop plane parallel with the yz plane. The loop plane of the LC parallel resonator LC1 is a virtual plane surrounded by the LC parallel resonator LC1.

The LC parallel resonator LC2 includes, as shown in FIG. 3, a coil L2 and a capacitor C2. As shown in FIG. 2, the LC parallel resonator LC2 includes a via-hole conductors b11 through b13, a line conductor layer 18b, a capacitor conductor layer 26b, and the ground conductor layer 30, and preferably has a loop-shaped configuration.

The capacitor C2 includes the capacitor conductor layer 26b and the ground conductor layer 30. The ground conductor layer 30 is a T-shaped conductor layer.

The capacitor conductor layer 26b is a conductor layer opposing the center portion 30b of the ground conductor layer 30 with the insulating layer 16d therebetween, and is disposed on the front surface of the insulating layer 16d. With this arrangement, the electrostatic capacitance is generated between the capacitor conductor layer 26b and the ground conductor layer 30, thus defining the capacitor C2. The capacitor conductor layer 26b preferably has a rectangular or substantially rectangular shape having the long sides in the x-axis direction and is disposed near the intersecting point of the diagonal lines of the insulating layer 16d.

The coil L2 includes the via-hole conductors b11 through b13 and the line conductor layer 18b. The line conductor layer 18b is disposed on the front surface of the insulating layer 16c and is a linear conductor extending in the y-axis direction. The line conductor layer 18b is disposed near the intersecting point of the diagonal lines of the insulating layer 16c.

The via-hole conductors b11 and b12 pass through the insulating layers 16c and 16d, respectively, in the z-axis direction. The end portion of the via-hole conductor b11 in the positive side of the z-axis direction is connected to the end portion of the line conductor layer 18b in the positive side of the y-axis direction. The end portion of the via-hole conductor b11 in the negative side of the z-axis direction is connected to the end portion of the via-hole conductor b12 in the positive side of the z-axis direction. The end portion of the via-hole conductor b12 in the negative side of the z-axis direction is connected to the ground conductor layer 30. With this arrangement, the via-hole conductors b11 and b12 define a single via-hole conductor extending from the end portion of the line conductor layer 18b in the positive side of the y-axis direction to the negative side of the z-axis direction, and are connected to the ground conductor layer 30.

The via-hole conductor b13 passes through the insulating layer 16c in the z-axis direction, and is disposed on the more negative side of the y-axis direction than the via-hole conductors b11 and b12. The end portion of the via-hole conductor b13 in the positive side of the z-axis direction is connected to the end portion of the line conductor layer 18b in the negative side of the y-axis direction. The end portion of the via-hole conductor b13 in the negative side of the z-axis direction is connected to the capacitor conductor layer 26b. With this arrangement, the via-hole conductor b13 extends from the end portion of the line conductor layer 18b in the negative side of the y-axis direction to the negative side of the z-axis direction, and is connected to the capacitor conductor layer 26b.

As described above, the coil L2 preferably has a loop-shaped configuration which starts from the connecting point between the via-hole conductor b12 and the ground conductor layer 30 as one end, passes through the via-hole conductors b11 and b12, the line conductor layer 18b, and the via-hole conductor b13, and reaches the connecting point between the via-hole conductor b13 and the capacitor conductor layer 26b as the other end.

The LC parallel resonator LC2 configured as described above defines a loop plane parallel with the yz plane. The loop plane of the LC parallel resonator LC2 is a virtual plane surrounded by the LC parallel resonator LC2.

The LC parallel resonator LC3 includes, as shown in FIG. 3, a coil L3 and a capacitor C3. As shown in FIG. 2, the LC parallel resonator LC3 includes via-hole conductors b21 through b25, a line conductor layer 18c, a capacitor conductor layer 26c, and the ground conductor layer 30, and preferably has a loop-shaped configuration.

The capacitor C3 includes the capacitor conductor layer 26c and the ground conductor layer 30. The ground conductor layer 30 is a T-shaped conductor layer.

The capacitor conductor layer 26c is a conductor layer opposing the end portion 30c of the ground conductor layer 30 with the insulating layer 16e therebetween, and is disposed on the front surface of the insulating layer 16f. With this arrangement, the electrostatic capacitance is generated between the capacitor conductor layer 26c and the ground conductor layer 30, thus defining the capacitor C3. The capacitor conductor layer 26c preferably has a rectangular or substantially rectangular shape having the long sides in the y-axis direction and is disposed on the more positive side of the x-axis direction than the intersecting point of the diagonal lines of the insulating layer 16f.

The coil L3 includes the via-hole conductors b21 through b25 and the line conductor layer 18c. The line conductor layer 18c is disposed on the front surface of the insulating layer 16c and is a linear conductor extending in the y-axis direction. The line conductor layer 18c is disposed on the more positive side of the x-axis direction than the intersecting point of the diagonal lines of the insulating layer 16c.

The via-hole conductors b21 through b23 pass through the insulating layers 16c through 16e, respectively, in the z-axis direction. The end portion of the via-hole conductor b21 in the positive side of the z-axis direction is connected to the end portion of the line conductor layer 18c in the positive side of the y-axis direction. The end portion of the via-hole conductor b21 in the negative side of the z-axis direction is connected to the end portion of the via-hole conductor b22 in the positive side of the z-axis direction. The end portion of the via-hole conductor b22 in the negative side of the z-axis direction is connected to the end portion of the via-hole conductor b23 in the positive side of the z-axis direction. The end portion of the via-hole conductor b23 in the negative side of the z-axis direction is connected to the capacitor conductor layer 26c. With this arrangement, the via-hole conductors b21 through b23 define a single via-hole conductor extending from the end portion of the line conductor layer 18c in the positive side of the y-axis direction to the negative side of the z-axis direction, and are connected to the capacitor conductor layer 26c.

The via-hole conductors b24 and b25 pass through the insulating layers 16c and 16d, respectively, in the z-axis direction, and are disposed on the more negative side of the y-axis direction than the via-hole conductors b21 through b23. The end portion of the via-hole conductor b24 in the positive side of the z-axis direction is connected to the end portion of the line conductor layer 18c in the negative side of the y-axis direction. The end portion of the via-hole conductor b24 in the negative side of the z-axis direction is connected to the end portion of the via-hole conductor b25 in the positive side of the z-axis direction. The end portion of the via-hole conductor b25 in the negative side of the z-axis direction is connected to the ground conductor layer 30. With this arrangement, the via-hole conductors b24 and b25 define a single via-hole conductor extending from the end portion of the line conductor layer 18c in the negative side of the y-axis direction to the negative side of the z-axis direction, and are connected to the ground conductor layer 30.

As described above, the coil L3 preferably has a loop-shaped configuration which starts from the connecting point between the via-hole conductor b25 and the ground conductor layer 30 as one end, passes through the via-hole conductors b24 and b25, the line conductor layer 18c, and the via-hole conductors b21 through b23, and reaches the connecting point between the via-hole conductor b23 and the capacitor conductor layer 26c as the other end.

The LC parallel resonator LC3 configured as described above defines a loop plane parallel with the yz plane. The loop plane of the LC parallel resonator LC3 is a virtual plane surrounded by the LC parallel resonator LC3.

The loop surface of the LC parallel resonator LC1 and the loop face of the LC parallel resonator LC3 sandwich the loop face of the LC parallel resonator LC2 therebetween. With this arrangement, as shown in FIG. 3, the coil L1 of the LC parallel resonator LC1 and the coil L2 of the LC parallel resonator LC2 are electromagnetically coupled to each other. The coil L2 of the LC parallel resonator LC2 and the coil L3 of the LC parallel resonator LC3 are also electromagnetically coupled to each other.

The capacitor C4 includes the line conductor layer 18a, a coupling conductor layer 20, and a via-hole conductor b30. The capacitor C5 includes the line conductor layer 18c, the coupling conductor layer 20, and the via-hole conductor b30.

The coupling conductor layer 20 is disposed on the front surface of the insulating layer 16b and preferably is T-shaped. More specifically, the coupling conductor layer 20 includes a coupling portion 20a and a connecting portion 20b. The coupling portion 20a provides a capacitance between the LC parallel resonators LC1 and LC2 adjacent to each other in the x-axis direction, and also provides a capacitance between the LC parallel resonators LC2 and LC3 adjacent to each other in the x-axis direction. The coupling portion 20a is a rectangular or substantially rectangular conductor extending in the x-axis direction, and, as viewed from the z-axis direction, the coupling portion 20a is superposed on the line conductor layers 18a through 18c. With this configuration, the coupling conductor layer 20 opposes the line conductor layer 18a with the insulating layer 16b therebetween, and also opposes the line conductor layer 18c with the insulating layer 16b therebetween. The connecting portion 20b projects from the center of the coupling portion 20a in the x-axis direction to the negative side of the y-axis direction. The via-hole conductor b30 passes through the insulating layer 16b in the z-axis direction. The end portion of the via-hole conductor b30 in the positive side of the z-axis direction is connected to the connecting portion 20b. The end portion of the via-hole conductor b30 in the negative side of the z-axis direction is connected to the line conductor layer 18b. That is, the coupling conductor layer 20 is connected to the line conductor layer 18b through the via-hole conductor b30. The electrostatic capacitance is generated between the coupling conductor layer 20 and the line conductor layer 18a, thus defining the capacitor C4. The capacitor C4 causes the LC parallel resonators LC1 and LC2 to be capacitively coupled to each other. The electrostatic capacitance is also generated between the coupling conductor layer 20 and the line conductor layer 18c, thus defining the capacitor C5. The capacitor C5 causes the LC parallel resonators LC2 and LC3 to be capacitively coupled to each other.

As shown in FIG. 1, the outer electrode 14a is disposed on the bottom surface of the multilayer body 12 in the negative side of the z-axis direction, and is used as an input electrode. That is, the outer electrode 14a is disposed on the back surface of the insulating layer 16g. The outer electrode 14b is disposed on the bottom surface of the multilayer body 12 in the negative side of the z-axis direction, and is used as a ground electrode. That is, the outer electrode 14b is disposed on the back surface of the insulating layer 16g. The outer electrode 14c is disposed on the bottom surface of the multilayer body 12 in the negative side of the z-axis direction, and is used as an output electrode. That is, the outer electrode 14c is disposed on the back surface of the insulating layer 16g. The outer electrodes 14a through 14c are arranged from the negative side to the positive side of the x-axis direction in this order.

The via-hole conductors b6 and b7 pass through the insulating layers 16f and 16g, respectively, in the z-axis direction, and connect the capacitor conductor layer 26a and the outer electrode 14a. The via-hole conductors b26 and b27 pass through the insulating layers 16f and 16g, respectively, in the z-axis direction, and connect the capacitor conductor layer 26c and the outer electrode 14c. The via-hole conductors b14 through b16 pass through the insulating layers 16e through 16g, respectively, in the z-axis direction, and connect the ground conductor layer 30 and the outer electrode 14b. The via-hole conductors b17 through b19 pass through the insulating layers 16e through 16g, respectively, in the z-axis direction, and connect the ground conductor layer 30 and the outer electrode 14b.

An example of the operation of the filter 10 will now be described below with reference to FIGS. 1 through 3. As shown in FIG. 3, a radio frequency signal Sig1 input from the outer electrode 14a first flows through the LC parallel resonator LC1.

The coils L1 and L2 are electromagnetically coupled to each other. Accordingly, when the radio frequency signal Sig1 flows through the LC parallel resonator LC1, a radio frequency signal Sig2 flows through the LC parallel resonator LC2 due to electromagnetic induction.

The coils L2 and L3 are electromagnetically coupled to each other. Accordingly, when the radio frequency signal Sig2 flows through the LC parallel resonator LC2, a radio frequency signal Sig3 flows through the LC parallel resonator LC3 due to electromagnetic induction. Then, the radio frequency signal Sig3 is output from the outer electrode 14b.

The LC parallel resonators LC1 through LC3 have natural resonant frequencies determined by the coils L1 through L3 and the capacitors C1 through C3, respectively. The impedances of the LC parallel resonators LC1 through LC3 become high in their resonant frequencies. Accordingly, the radio frequency signal Sig3 of a predetermined frequency band determined by the resonant frequencies does not flow to a ground via the outer electrode 14b, but is output from the outer electrode 14c.

A non-limiting example of a manufacturing method for the filter 10 will be described below with reference to FIGS. 1 and 2.

Ceramic green sheets, which will form the insulating layers 16a through 16g, are first prepared. Then, the via-hole conductors b1 through b7, b11 through b19, b21 through b27, and b30 are formed in the ceramic green sheets, which will form the insulating layers 16b through 16g. More specifically, via-holes are formed by applying a laser beam to the ceramic green sheets, which will form the insulating layers 16b through 16g. Then, a conductive paste made of Ag, Pd, Cu, Au, or an alloy thereof is filled into these via-holes preferably via print coating.

Then, a conductive paste made of Ag, Pd, Cu, Au, or an alloy thereof as a principal component is applied to the front surfaces of the ceramic green sheets which will form the insulating layers 16b through 16f by using a screen printing or photolithographic process, thus defining the line conductor layers 18a through 18c, the coupling conductor layer 20, the capacitor conductor layers 26a through 26c, and the ground conductor layer 30. Then, a conductive paste made of Ag, Pd, Cu, Au, or an alloy thereof as a principal component is applied to the back surface of the ceramic green sheet which will form the insulating layer 16g by using a screen printing or photolithographic process, thus defining conductor electrodes, which will form the outer electrodes 14a through 14c. A conductive paste may be filled into the via-holes when forming the conductor electrodes, the line conductor layers 18a through 18c, the coupling conductor layer 20, the capacitor conductor layers 26a through 26c, and the ground conductor layer 30.

Then, the ceramic green sheets are stacked on each other. This will be explained more specifically. The ceramic green sheet which will form the insulating layer 16g is placed. Then, the ceramic green sheet which will form the insulating layer 16f is placed on the ceramic green sheet which will form the insulating layer 16g. Thereafter, the ceramic green sheet which will form the insulating layer 16f is pressed against the ceramic green sheet which will form the insulating layer 16g. Thereafter, similarly, the ceramic green sheets which will form the insulating layers 16e, 16d, 16c, 16b, and 16a are stacked and temporarily pressed against each other in this order. According to the above-described process, a mother multilayer body is formed. Then, this mother multilayer body is subjected to final pressing via, for example, isostatic pressing.

The mother multilayer body is cut into multilayer bodies 12 of a predetermined size by using a cutting blade. Then, debinding and firing is performed on the unfired multilayer bodies 12.

According to the above-described process, the fired multilayer bodies 12 are obtained. Then, barrel polishing is performed on each multilayer body 12, thereby chamfering the multilayer body 12.

Finally, Ni-plating or Sn-plating is performed on the front surfaces of the conductor electrodes, thus defining the outer electrodes 14a through 14c. According to the above-described process, the filter 10 shown in FIG. 1 is fabricated.

In the filter 10 configured as described above, it is possible to intensify capacitive coupling between the LC parallel resonators LC1 and LC2 and between the LC parallel resonators LC2 and LC3. This will be discussed more specifically. In the multilayer band pass filter 500 disclosed in Japanese Unexamined Patent Application Publication No. 2011-71921, the LC parallel resonators 504 and 516 are capacitively coupled to each other due to the capacitance between the via-hole electrodes 508 and 520 and the capacitance between the via-hole electrodes 510 and 522. The via-hole electrodes 508, 510, 520, and 522 are relatively thin. Accordingly, in order to provide a large capacitance between the via-hole electrodes 508 and 510 and between the via-hole electrodes 510 and 522, it is necessary to decrease the distances between the via-hole electrodes 508 and 520 and between the via-hole electrodes 510 and 522.

However, if the distances between the via-hole electrodes 508 and 520 and between the via-hole electrodes 510 and 522 are excessively decreased, short-circuiting may occur between the via-hole electrodes 508 and 520 and between the via-hole electrodes 510 and 522. Thus, in the multilayer band pass filter 500, it may be difficult to intensify capacitive coupling between the LC parallel resonators 504 and 516 to satisfy a desired frequency characteristic.

Accordingly, in the filter 10, the coupling conductor layer 20 provides a capacitance between the two line conductor layers 18a and 18b adjacent to each other in the x-axis direction and also provides a capacitance between the two line conductor layers 18b and 18c adjacent to each other in the x-axis direction. Since the coupling conductor layer 20 is a conductor layer disposed on the insulating layer 16b, it opposes the line conductor layers 18a and 18c with the insulating layer 16b therebetween. Thus, a relatively large capacitance is provided between the coupling conductor layer 20 and each of the line conductor layers 18a and 18c. With this configuration, it is possible to provide a large capacitance between the LC parallel resonators LC1 and LC2 and between the LC parallel resonators LC2 and LC3 without decreasing the distances between the LC parallel resonators LC1 and LC2 and between the LC parallel resonators LC2 and LC3. As a result, in the filter 10, it is possible to intensity capacitive coupling between the LC parallel resonators LC1 and LC2 and between the LC parallel resonators LC2 and LC3.

For more clearly understanding the advantages achieved by the filter 10, the inventor of this application conducted the following computer simulations. More specifically, the inventor made first through third non-limiting example models of the filter 10 and fourth and fifth models of filters according to comparative examples.

The first model is a filter 10 in which the width of the coupling conductor layer 20 in the y-axis direction is set to be 125 µm. The second model is a filter 10 in which the width of the coupling conductor layer 20 in the y-axis direction is set to be 150 µm. The third model is a filter 10 in which the width of the coupling conductor layer 20 in the y-axis direction is set to be 100 µm.

The fourth model is a filter without the coupling conductor layer 20. The fifth model is also a filter without the coupling conductor layer 20. However, in the fifth model, the distances among the LC parallel resonators LC1 through LC3 are smaller than those of the fourth model so as to increase the amount of coupling among the LC parallel resonators LC1 through LC3.

Figure 4:
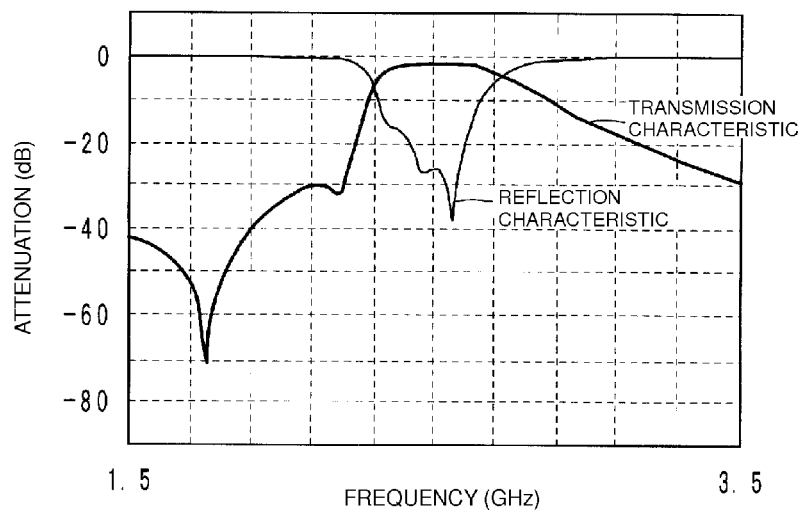
FIG. 4 is a graph indicating simulation results of a first model.
Figure 5:
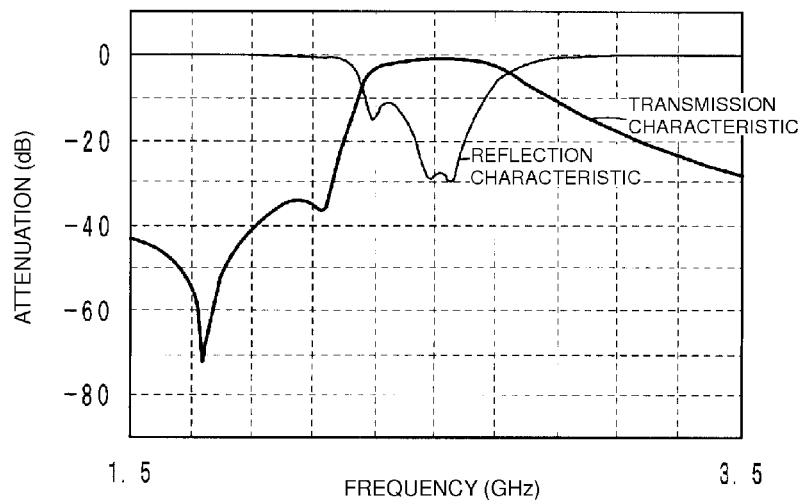
FIG. 5 is a graph indicating simulation results of a second model.
Figure 6:
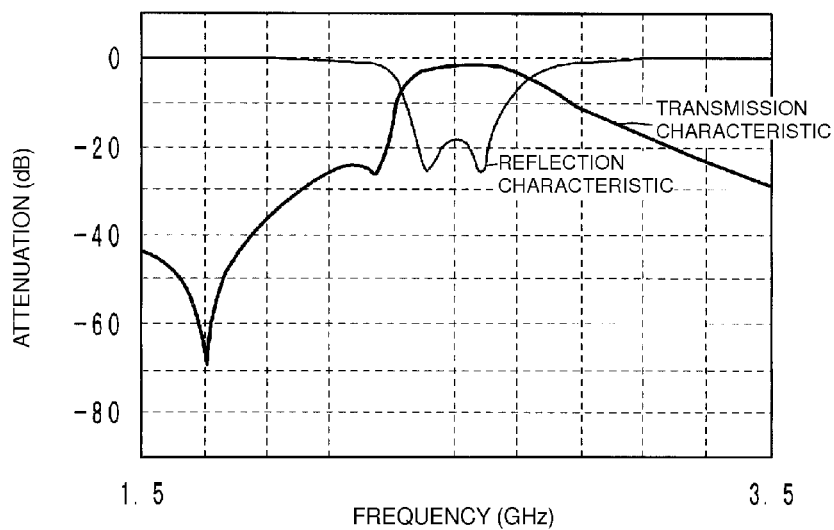
FIG. 6 is a graph indicating simulation results of a third model.
Figure 7:
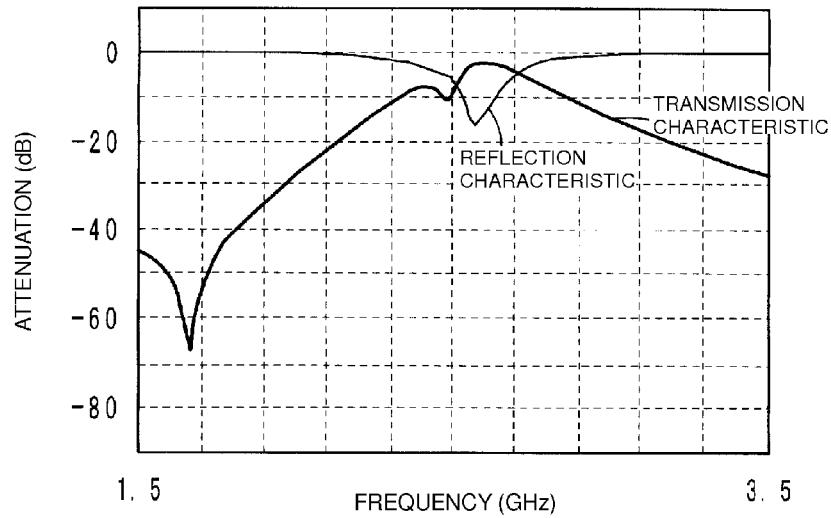
FIG. 7 is a graph indicating simulation results of a fourth model.
Figure 8:
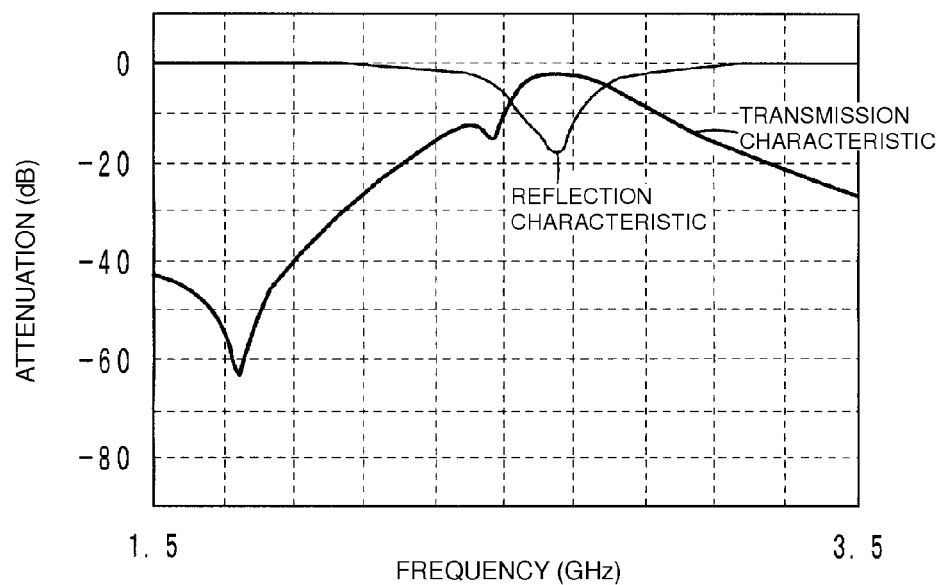
FIG. 8 is a graph indicating simulation results of a fifth model.

The inventor of this application examined the transmission characteristic and the reflection characteristic of the first through fifth models. The transmission characteristic is the relationship between the attenuation of an output signal output from the outer electrode 14b with respect to an input signal input from the outer electrode 14a and the frequency of the input signal. The reflection characteristic is the relationship between the attenuation of a reflected signal output from the outer electrode 14a with respect to an input signal input from the outer electrode 14a and the frequency of the input signal. FIG. 4 is a graph indicating the simulation results of the first model. FIG. 5 is a graph indicating the simulation results of the second model. FIG. 6 is a graph indicating the simulation results of the third model. FIG. 7 is a graph indicating the simulation results of the fourth model. FIG. 8 is a graph indicating the simulation results of the fifth model. The vertical axis indicates the attenuation, and the horizontal axis indicates the frequency.

The graph of FIG. 7 shows that the pass band of the fourth model is very narrow. This is because the capacitance values of the capacitors C4 and C5 shown in FIG. 3 are very small due to the absence of the coupling conductor layer 20. The pass band is a frequency difference between the two points at which attenuations which are 3 dB lower than the smallest attenuation of the transmission characteristic in the drawing intersect with the transmission characteristic.

The graph of FIG. 8 shows that the pass band of the fifth model is wider than that of the fourth model. The reason for this is that, due to a smaller distance between the LC parallel resonators LC1 through LC3, the capacitance values of the capacitors C4 and C5 are increased, thus increasing the pass bandwidth of the filter. However, even in the fifth model, the pass band is not sufficiently wide compared with the first model.

Upon comparing the graphs of FIGS. 4 through 6 with the graphs of FIGS. 7 and 8, it is seen that the pass bands of the first through third models are wider than those of the fourth and fifth models. Thus, it can be validated that, by the provision of the coupling conductor layer 20, the pass bandwidth of the filter 10 is increased.

The graphs of FIGS. 4 through 6 show that the pass band of the second model is the widest among the three models and the pass band of the third model is the narrowest among the three models. This is because the width of the coupling conductor layer 20 in the y-axis direction in the second model is the largest width and that the width of the coupling conductor layer 20 in the y-axis direction in the third model is the smallest width. That is, it is understood that, as the width of the coupling conductor layer 20 in the y-axis direction is larger, the capacitance values of the capacitors C4 and C5 are increased, thus increasing the pass bandwidth of the filter 10.

First Modified Example

Figure 9:
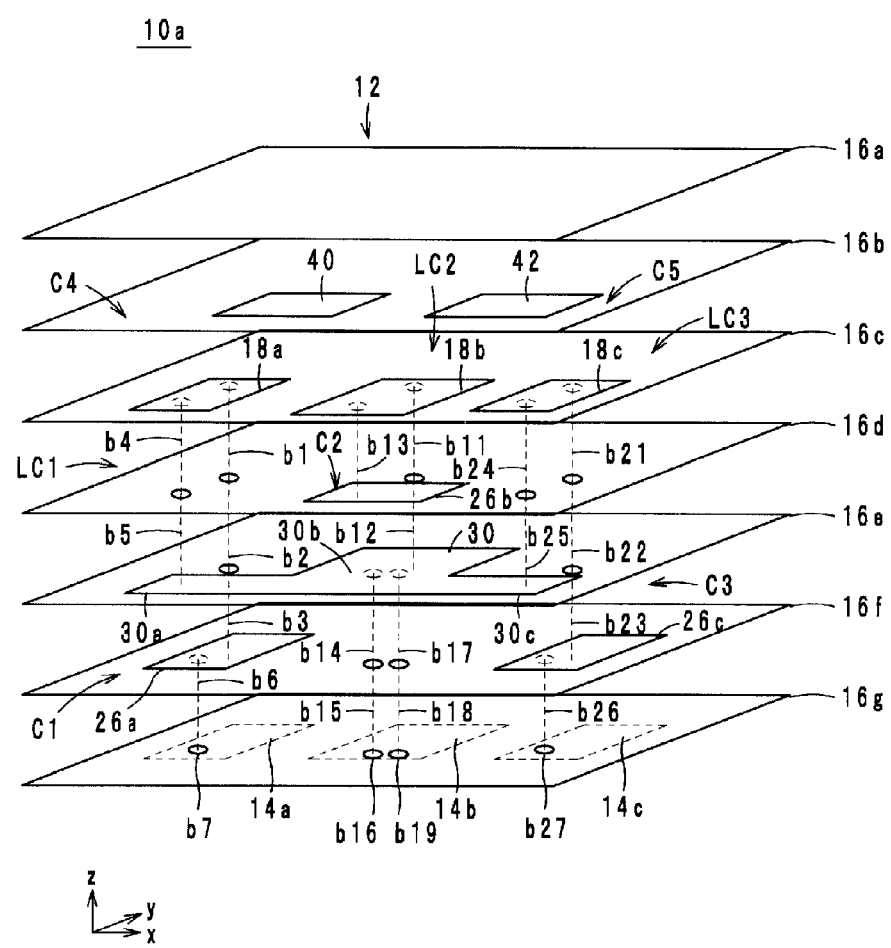
FIG. 9 is an exploded perspective view of a multilayer body of a filter according to a first modified example of a preferred embodiment of the present invention.

A filter 10a of a first modified example of a preferred embodiment of the present invention will be described below with reference to the drawing. FIG. 9 is an exploded perspective view of a multilayer body 12 of the filter 10a according to the first modified example. In FIG. 9, the same configurations as those of the filter 10 are designated by like reference numerals. Concerning the external perspective view of the filter 10a, FIG. 1 is used, and concerning the equivalent circuit diagram of the filter 10a, FIG. 3 is used.

The filter 10a is different from the filter 10 in that coupling conductor layers 40 and 42 are provided instead of the coupling conductor layer 20. This will be discussed more specifically. A capacitor C4 includes the line conductor layers 18a and 18b and the coupling conductor layer 40. The coupling conductor layer 40 is disposed on the front surface of the insulating layer 16b, and, as viewed from the z-axis direction, the coupling conductor layer 40 is superposed on the line conductor layers 18a and 18b which are adjacent to each other in the x-axis direction. That is, the coupling conductor layer 40 opposes the line conductor layers 18a and 18b which are adjacent to each other in the x-axis direction with the insulating layer 16b therebetween. With this arrangement, a capacitance is provided between the coupling conductor layer 40 and the line conductor layer 18a and a capacitance is provided between the coupling conductor layer 40 and the line conductor layer 18b. As a result, a capacitance is provided between the line conductor layers 18a and 18b, and accordingly, a capacitance (capacitor C4) is provided between the LC parallel resonators LC1 and LC2 adjacent to each other in the x-axis direction. However, since the coupling conductor layer 40 is not superposed on the line conductor layer 18c, as viewed from the z-axis direction, it does not provide a capacitance between the line conductor layers 18a and 18c, which are not adjacent to each other in the x-axis direction.

A capacitor C5 includes the line conductor layers 18b and 18c and the coupling conductor layer 42. The coupling conductor layer 42 is disposed on the front surface of the insulating layer 16b, and, as viewed from the z-axis direction, the coupling conductor layer 42 is superposed on the line conductor layers 18b and 18c which are adjacent to each other in the x-axis direction. That is, the coupling conductor layer 42 opposes the line conductor layers 18b and 18c which are adjacent to each other in the x-axis direction with the insulating layer 16b therebetween. With this arrangement, a capacitance is provided between the coupling conductor layer 42 and the line conductor layer 18b and a capacitance is provided between the coupling conductor layer 42 and the line conductor layer 18c. As a result, a capacitance is provided between the line conductor layers 18b and 18c, and accordingly, a capacitance (capacitor C5) is provided between the LC parallel resonators LC2 and LC3 adjacent to each other in the x-axis direction. However, since the coupling conductor layer 42 is not superposed on the line conductor layer 18a, as viewed from the z-axis direction, it does not provide a capacitance between the line conductor layers 18a and 18c, which are not adjacent to each other in the x-axis direction.

The other configurations of the filter 10a are the same as those of the filter 10, and an explanation thereof will thus be omitted.

In the filter 10a configured as described above, it is possible to intensify capacitive coupling between the LC parallel resonators LC1 and LC2 and between the LC parallel resonators LC2 and LC3, as in the filter 10.

Second Modified Example

Figure 10:
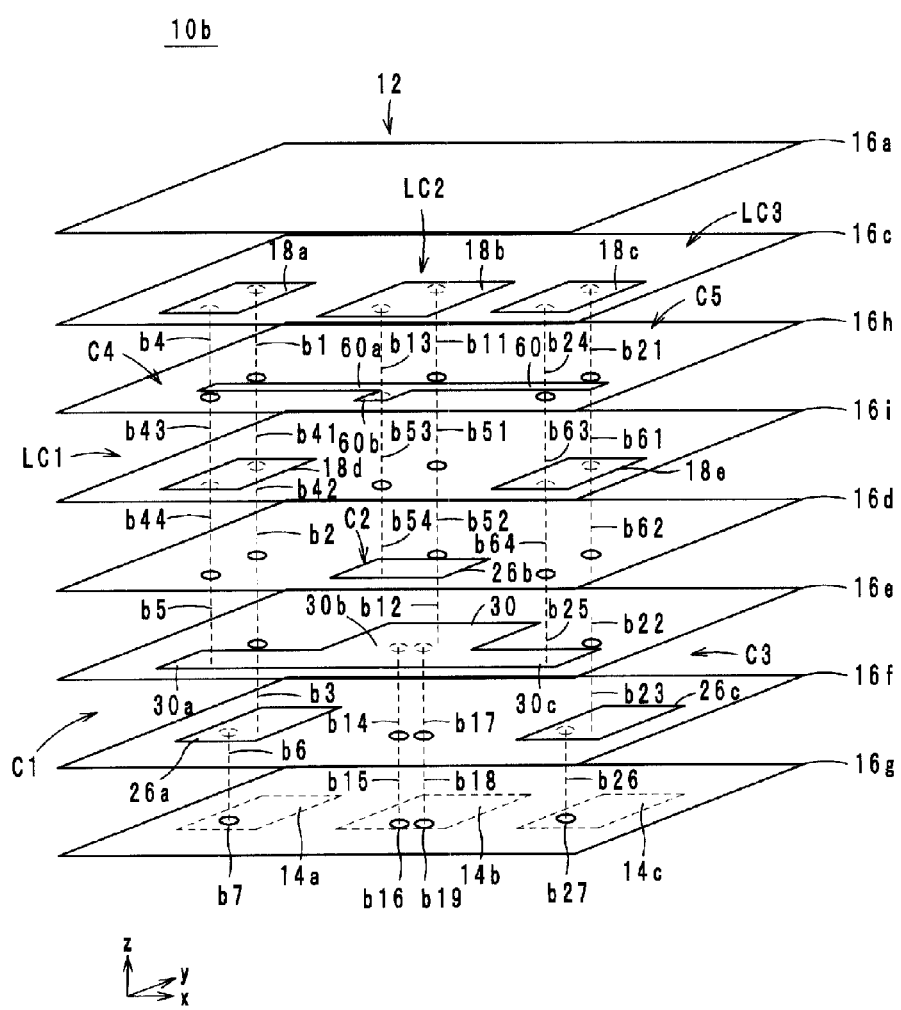
FIG. 10 is an exploded perspective view of a multilayer body of a filter according to a second modified example of a preferred embodiment of the present invention.

A filter 10b of a second modified example of a preferred embodiment of the present invention will be described below with reference to the drawing. FIG. 10 is an exploded perspective view of a multilayer body 12 of the filter 10b according to the second modified example. In FIG. 10, the same configurations as those of the filter 10 are designated by like reference numerals. Concerning the external perspective view of the filter 10b, FIG. 1 is used, and concerning the equivalent circuit diagram of the filter 10b, FIG. 3 is used.

The filter 10b is different from the filter 10 in that a coupling conductor layer 60 is provided instead of the coupling conductor layer 20. More specifically, in the filter 10b, the insulating layer 16b is not disposed, and instead, insulating layers 16h and 16i are disposed. The insulating layers 16h and 16i are stacked on each other between the insulating layers 16c and 16d.

The coupling conductor layer 60 preferably has the same shape as that of the coupling conductor layer 20, and is disposed on the front surface of the insulating layer 16h. With this arrangement, the coupling conductor layer 60 is disposed on the more negative side of the z-axis direction than the line conductor layers 18a through 18c.

Via-hole conductors b41, b43, b51, b53, b61, and b63 are provided in the insulating layer 16h. The via-hole conductor b41 is connected to the via-hole conductor b1. The via-hole conductor b43 is connected to the via-hole conductor b4. The via-hole conductor b51 is connected to the via-hole conductor b11. The via-hole conductor b53 is connected to the via-hole conductor b13. The via-hole conductor b61 is connected to the via-hole conductor b21. The via-hole conductor b63 is connected to the via-hole conductor b24.

Line conductor layers 18d and 18e are disposed on the front surface of the insulating layer 16i. The line conductor layer 18d is completely superposed on the line conductor layer 18a, as viewed from the z-axis direction. The coupling conductor layer 60 is disposed between the line conductor layers 18a and 18d in the z-axis direction. Accordingly, the line conductor layers 18a and 18d oppose the coupling conductor layer 60 from both sides of the z-axis direction. With this configuration, a capacitance is provided between each of the line conductor layers 18a and 18d and the coupling conductor layer 60, and accordingly, a capacitance (capacitor C4) is provided between the LC parallel resonators LC1 and LC2 adjacent to each other in the x-axis direction. The line conductor layers 18a and 18d may be partially superposed on each other, instead of being completely superposed on each other. In this case, too, the capacitance (capacitor C4) is provided.

The line conductor layer 18e is completely superposed on the line conductor layer 18c, as viewed from the z-axis direction. The coupling conductor layer 60 is disposed between the line conductor layers 18c and 18e in the z-axis direction. Accordingly, the line conductor layers 18c and 18e oppose the coupling conductor layer 60 from both sides of the z-axis direction. With this configuration, a capacitance is provided between each of the line conductor layers 18c and 18e and the coupling conductor layer 60, and accordingly, a capacitance (capacitor C5) is provided between the LC parallel resonators LC2 and LC3 adjacent to each other in the x-axis direction. The line conductor layers 18c and 18e may be partially superposed on each other, instead of being completely superposed on each other. In this case, too, the capacitance (capacitor C5) is provided.

In the insulating layer 16i, via-hole conductors b42, b44, b52, b54, b62, and b64 are provided. The via-hole conductor b42 is connected to the via-hole conductors b41 and b2. The via-hole conductor b44 is connected to the via-hole conductors b43 and b5. The via-hole conductor b52 is connected to the via-hole conductors b51 and b12. The via-hole conductor b54 is connected to the via-hole conductor b53 and the capacitor conductor layer 26b. The via-hole conductor b62 is connected to the via-hole conductors b61 and b22. The via-hole conductor b64 is connected to the via-hole conductors b63 and b25. That is, in the filter 10b, in the LC parallel resonator LC1, the line conductor layers 18a and 18d are connected in parallel with each other, and in the LC parallel resonator LC2, the line conductor layers 18c and 18e are connected in parallel with each other.

The other configurations of the filter 10b are the same as those of the filter 10, and an explanation thereof will thus be omitted.

In the filter 10b configured as described above, it is possible to intensify capacitive coupling between the LC parallel resonators LC1 and LC2 and between the LC parallel resonators LC2 and LC3, as in the filter 10.

Additionally, in the filter 10b, the coupling conductor layer 60 opposes the line conductor layer 18d, as well as the line conductor layer 18a. With this configuration, the capacitance value of the capacitor C4 of the filter 10b is greater than that of the capacitor C4 of the filter 10. Similarly, the coupling conductor layer 60 opposes the line conductor layer 18e, as well as the line conductor layer 18c. With this configuration, the capacitance value of the capacitor C5 of the filter 10b is greater than that of the capacitor C5 of the filter 10.

Third Modified Example

Figure 11:
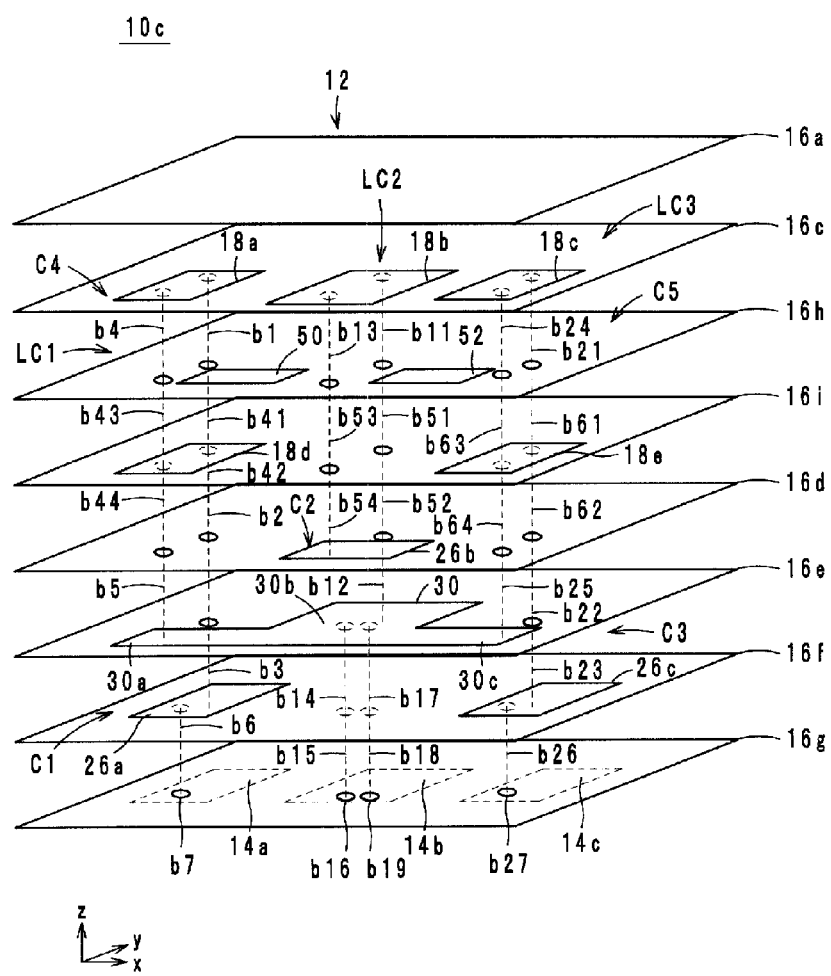
FIG. 11 is an exploded perspective view of a multilayer body of a filter according to a third modified example of a preferred embodiment of the present invention.

A filter 10c of a third modified example of a preferred embodiment of the present invention will be described below with reference to the drawing. FIG. 11 is an exploded perspective view of a multilayer body 12 of the filter 10c according to the third modified example. In FIG. 11, the same configurations as those of the filter 10 are designated by like reference numerals. Concerning the external perspective view of the filter 10c, FIG. 1 is used, and concerning the equivalent circuit diagram of the filter 10c, FIG. 3 is used.

The filter 10c is different from the filter 10b in that coupling conductor layers 50 and 52 are provided instead of the coupling conductor layer 60. This will be discussed more specifically. A capacitor C4 includes the line conductor layers 18a, 18b, and 18d and the coupling conductor layer 50. The coupling conductor layer 50 is disposed on the front surface of the insulating layer 16h, and, as viewed from the z-axis direction, the coupling conductor layer 50 is superposed on the line conductor layers 18a, 18b, and 18d. That is, the coupling conductor layer 50 opposes the line conductor layers 18a and 18b with the insulating layer 16c therebetween and opposes the line conductor layer 18d with the insulating layer 16h therebetween. With this arrangement, a capacitance is provided between the coupling conductor layer 50 and the line conductor layer 18a, a capacitance is provided between the coupling conductor layer 50 and the line conductor layer 18b, and a capacitance is provided between the coupling conductor layer 50 and the line conductor layer 18d. As a result, a capacitance is provided between each of the line conductor layers 18a and 18d and the line conductor layer 18b, and accordingly, a capacitance (capacitor C4) is provided between the LC parallel resonators LC1 and LC2 adjacent to each other in the x-axis direction. However, since the coupling conductor layer 50 is neither superposed on the line conductor layer 18c nor 18e, as viewed from the z-axis direction, it does not provide a capacitance between a set of the line conductor layers 18a and 18d and a set of the line conductor layers 18c and 18e, which are not adjacent to each other in the x-axis direction.

A capacitor C5 includes the line conductor layers 18b, 18c, and 18e and the coupling conductor layer 52. The coupling conductor layer 52 is disposed on the front surface of the insulating layer 16h, and, as viewed from the z-axis direction, the coupling conductor layer 52 is superposed on the line conductor layers 18b, 18c, and 18e. That is, the coupling conductor layer 52 opposes the line conductor layers 18b and 18c with the insulating layer 16c therebetween and opposes the line conductor layer 18e with the insulating layer 16h therebetween. With this arrangement, a capacitance is provided between the coupling conductor layer 52 and the line conductor layer 18c, a capacitance is provided between the coupling conductor layer 52 and the line conductor layer 18b, and a capacitance is provided between the coupling conductor layer 52 and the line conductor layer 18e. As a result, a capacitance is provided between each of the line conductor layers 18c and 18e and the line conductor layer 18b, and accordingly, a capacitance (capacitor C5) is provided between the LC parallel resonators LC2 and LC3 adjacent to each other in the x-axis direction. However, since the coupling conductor layer 52 is neither superposed on the line conductor layer 18a nor 18d, as viewed from the z-axis direction, it does not provide a capacitance between a set of the line conductor layers 18a and 18d and a set of the line conductor layers 18c and 18e, which are not adjacent to each other in the x-axis direction.

The other configurations of the filter 10c preferably are the same as those of the filter 10b, and an explanation thereof will thus be omitted.

In the filter 10c configured as described above, it is possible to intensify capacitive coupling between the LC parallel resonators LC1 and LC2 and between the LC parallel resonators LC2 and LC3, as in the filter 10b.

Additionally, in the filter 10c, the coupling conductor layer 50 opposes the line conductor layer 18d, as well as the line conductor layer 18a. With this configuration, the capacitance value of the capacitor C4 of the filter 10c is greater than that of the capacitor C4 of the filter 10a. Similarly, the coupling conductor layer 52 opposes the line conductor layer 18e, as well as the line conductor layer 18c. With this configuration, the capacitance value of the capacitor C5 of the filter 10c is greater than that of the capacitor C5 of the filter 10a.

Fourth Modified Example

Figure 12:
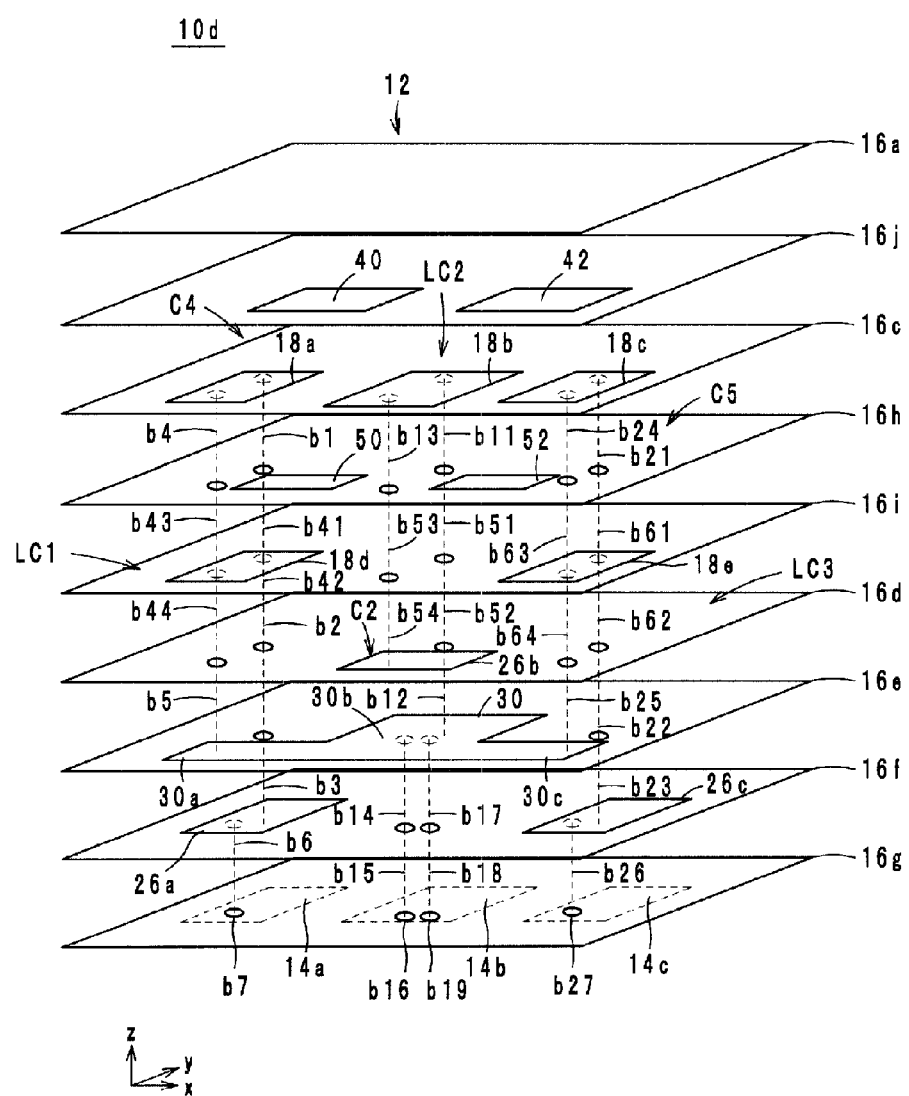
FIG. 12 is an exploded perspective view of a multilayer body of a filter according to a fourth modified example of a preferred embodiment of the present invention.

A filter 10d of a fourth modified example of a preferred embodiment of the present invention will be described below with reference to the drawing. FIG. 12 is an exploded perspective view of a multilayer body 12 of the filter 10d according to the fourth modified example. In FIG. 12, the same configurations as those of the filter 10 are designated by like reference numerals. Concerning the external perspective view of the filter 10d, FIG. 1 is used, and concerning the equivalent circuit diagram of the filter 10d, FIG. 3 is used.

As in the filter 10d shown in FIG. 12, the filter 10a shown in FIG. 9 and the filter 10c shown in FIG. 11 may be combined. That is, the filter 10d includes the coupling conductor layers 40, 42, 50, and 52. Accordingly, in the z-axis direction, the coupling conductor layers 40 and 42 are disposed on one side of the line conductor layers 18a through 18c, and the coupling conductor layers 50 and 52 are disposed on the other side of the line conductor layers 18a through 18c. With this configuration, the capacitance values of the capacitors C4 and C5 in the filter 10d are greater than those in the filter 10a or 10c.

Fifth Modified Example

Figure 13:
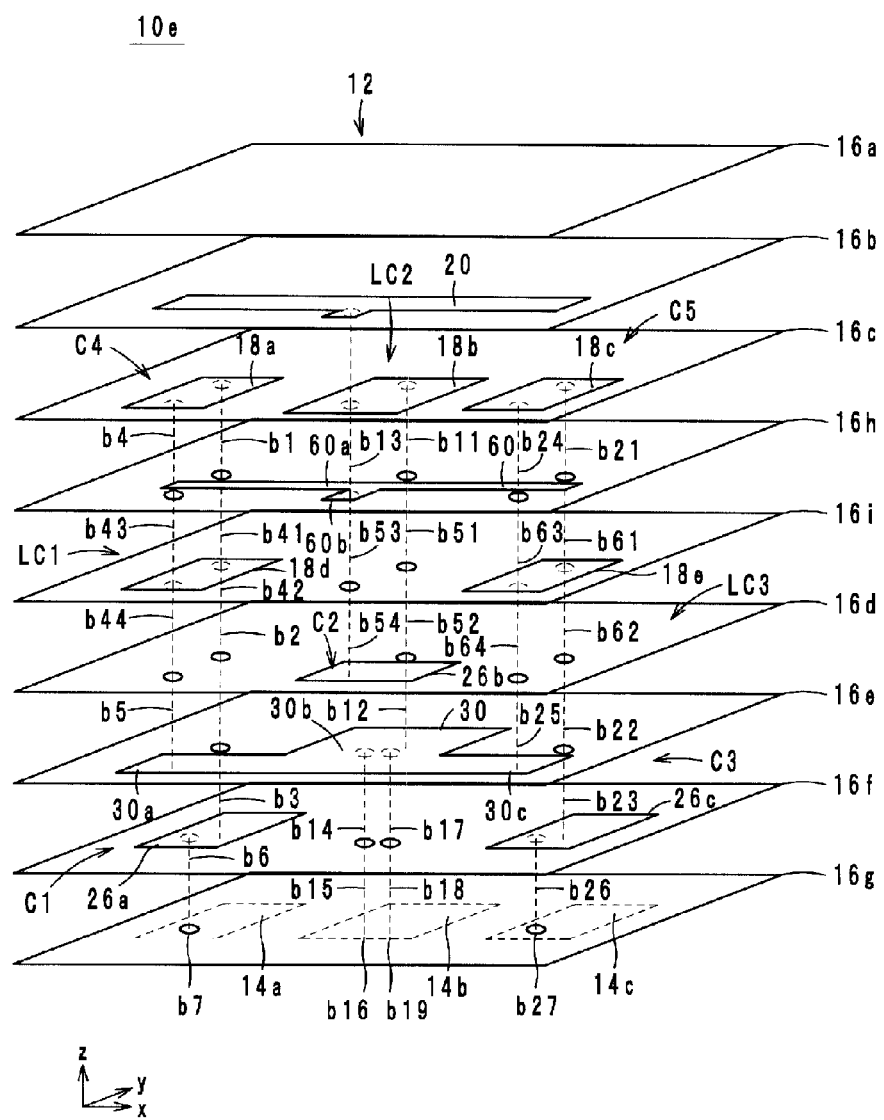
FIG. 13 is an exploded perspective view of a multilayer body of a filter according to a fifth modified example of a preferred embodiment of the present invention.
Figure 14:
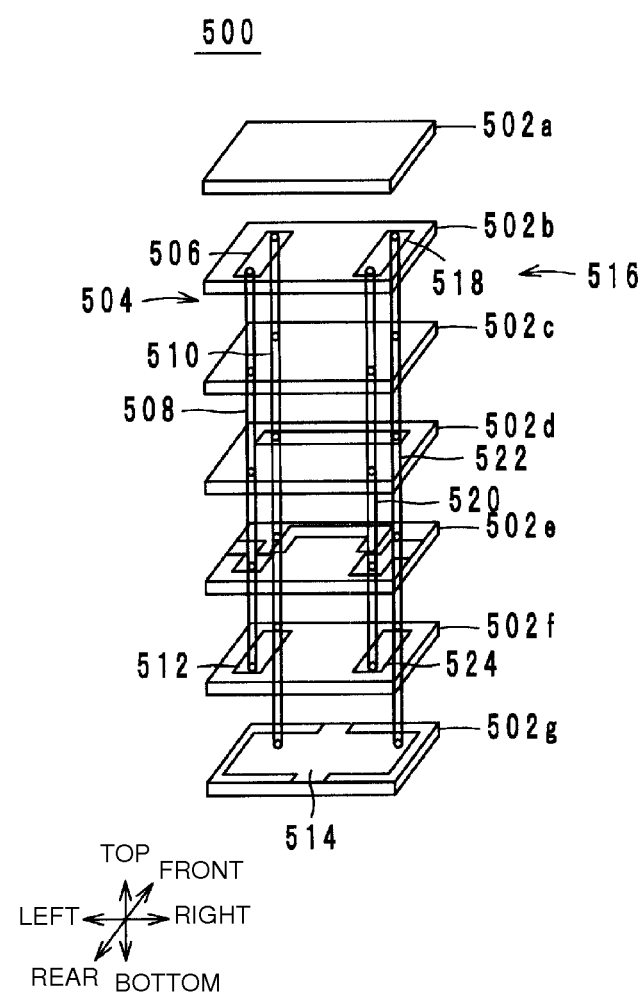
FIG. 14 is an exploded perspective view of a multilayer band pass filter disclosed in Japanese Unexamined Patent Application Publication No. 2011-71921.

A filter 10e of a fifth modified example of a preferred embodiment of the present invention will be described below with reference to the drawing. FIG. 13 is an exploded perspective view of a multilayer body 12 of the filter 10e according to the fifth modified example. In FIG. 13, the same configurations as those of the filter 10 are designated by like reference numerals. Concerning the external perspective view of the filter 10e, FIG. 1 is used, and concerning the equivalent circuit diagram of the filter 10e, FIG. 3 is used.

As in the filter 10e shown in FIG. 13, the filter 10 shown in FIG. 2 and the filter 10b shown in FIG. 10 may be combined. That is, the filter 10e includes the coupling conductor layers 20 and 60. Accordingly, in the z-axis direction, the coupling conductor layer 20 is disposed on one side of the line conductor layers 18a through 18c, and the coupling conductor layer 60 is disposed on the other side of the line conductor layers 18a through 18c. With this configuration, the capacitance values of the capacitors C4 and C5 in the filter 10e are greater than those in the filter 10 or 10b.

Other Preferred Embodiments

The filter according to the present invention is not restricted to the filters 10, and 10a through 10e, and may be modified within the spirit of the present invention.

For example, instead of connecting the outer electrodes 14a and 14c to the capacitor electrodes 26a and 26c, respectively, through via-hole conductors, they may be connected to each other through the use of a capacitance provided by an insulating layer.

The number of LC parallel resonators may be any number as long as it is three or more.

Preferred embodiments of the present invention are useful as a filter and are particularly excellent in intensifying capacitive coupling between LC parallel resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter comprising:
   a multilayer body including a plurality of insulating layers stacked on each other in a stacking direction;
   a plurality of LC parallel resonators that are arranged along a first direction which is perpendicular or substantially perpendicular to the stacking direction and that each of the plurality of LC parallel resonators includes a coil and a capacitor including a plurality of conductor layers; and
   at least one coupling conductor layer disposed on one of the plurality of insulating layers; wherein
   LC parallel resonators of the plurality of LC parallel resonators which are adjacent to each other in the first direction are electromagnetically coupled to each other;
   each coil of the plurality of LC parallel resonators includes:
      a line conductor layers disposed on one of the plurality of insulating layers,
      a first via-hole conductor that extends from the line conductor layer to one side of the stacking direction and that is electrically connected to one of the plurality of conductor layers of the corresponding capacitor, and
      a second via-hole conductor that extends from the line conductor layer to the one side of the stacking direction and that is electrically connected to another one of the plurality of conductor layers of the corresponding capacitor;
   the at least one coupling conductor layer provides a capacitance between two of the line conductor layers which are adjacent to each other in the first direction;
   at least one of the LC parallel resonators which are adjacent to each other in the first direction includes a plurality of the line conductor layers; and the at least one coupling conductor layer is disposed between the plurality of line conductor layers in the stacking direction.

2. The filter according to claim 1, wherein the at least one coupling conductor layer does not provide a capacitance between the respective line conductor layers which are not adjacent to each other in the first direction.

3. The filter according to claim 1, wherein the at least one coupling conductor layer is connected, through another via-hole conductor, to one of the two line conductor layers which are adjacent to each other in the first direction, and the at least one coupling conductor layer opposes the other one of the two line conductor layers with one of the plurality of insulating layers therebetween.

4. The filter according to claim 1, wherein the at least one coupling conductor layer opposes each of the two line conductor layers which are adjacent to each other in the first direction with one of the plurality of insulating layers therebetween.

5. The filter according to claim 1, wherein the at least one coupling conductor layer includes a plurality of coupling conductor layers that are disposed on each side of the two line conductor layers which are adjacent to each other, in the stacking direction.

6. The filter according to claim 1, wherein the at least one coupling conductor layer includes two coupling conductor layers.

7. The filter according to claim 1, wherein a number of the plurality of LC parallel resonators is three or more.

8. The filter according to claim 1, wherein each of the coils has a loop-shaped configuration.

9. A multilayer bandpass filter comprising:
a multilayer body including a plurality of insulating layers stacked on each other in a stacking direction;
a plurality of LC parallel resonators that are arranged along a first direction which is perpendicular or substantially perpendicular to the stacking direction and that each of the plurality of LC parallel resonators includes a coil and a capacitor including a plurality of conductor layers; and
at least one coupling conductor layer disposed on one of the plurality of insulating layers; wherein
LC parallel resonators of the plurality of LC parallel resonators which are adjacent to each other in the first direction are electromagnetically coupled to each other;
each coil of the plurality of LC parallel resonators includes:
a line conductor layers disposed on one of the plurality of insulating layers,
a first via-hole conductor that extends from the line conductor layer to one side of the stacking direction and that is electrically connected to one of the plurality of conductor layers of the corresponding capacitor, and
a second via-hole conductor that extends from the line conductor layer to the one side of the stacking direction and that is electrically connected to another one of the plurality of conductor layers of the corresponding capacitor;

the at least one coupling conductor layer provides a capacitance between two of the line conductor layers which are adjacent to each other in the first direction;

at least one of the LC parallel resonators which are adjacent to each other in the first direction includes a plurality of the line conductor layers; and the at least one coupling conductor layer is disposed between the plurality of line conductor layers in the stacking direction.

10. The multilayer bandpass filter according to claim 9, wherein the at least one coupling conductor layer includes two coupling conductor layers.

11. The multilayer bandpass filter according to claim 9, wherein each of the coils has a loop-shaped configuration.

12. The multilayer bandpass filter according to claim 9, wherein the at least one coupling conductor layer does not provide a capacitance between the respective line conductor layers which are not adjacent to each other in the first direction.

13. The multilayer bandpass filter according to claim 9, wherein the at least one coupling conductor layer is connected, through another via-hole conductor, to one of the two line conductor layers which are adjacent to each other in the first direction, and the at least one coupling conductor layer opposes the other one of the two line conductor layers with one of the plurality of insulating layers therebetween.

14. The multilayer bandpass filter according to claim 9, wherein the at least one coupling conductor layer opposes each of the two line conductor layers which are adjacent to each other in the first direction with one of the plurality of insulating layers therebetween.

15. The multilayer bandpass filter according to claim 9, wherein the at least one coupling conductor layer includes a plurality of coupling conductor layers that are disposed on each side of the two line conductor layers which are adjacent to each other, in the stacking direction.

16. The multilayer bandpass filter according to claim 9, wherein a number of the plurality of LC parallel resonators is three or more.

* * * * *